(12) United States Patent
Wang et al.

(10) Patent No.: US 8,049,218 B2
(45) Date of Patent: Nov. 1, 2011

(54) TFT LCD ARRAY SUBSTRATE AND MANUFACTURING METHOD THEREOF

(75) Inventors: Zhangtao Wang, Beijing (CN); Haijun Qiu, Beijing (CN); Tae Yup Min, Beijing (CN); Seung Moo Rim, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 12/830,831

(22) Filed: Jul. 6, 2010

(65) Prior Publication Data

US 2010/0270556 A1    Oct. 28, 2010

Related U.S. Application Data

(62) Division of application No. 11/935,002, filed on Nov. 5, 2007, now Pat. No. 7,776,662.

(30) Foreign Application Priority Data

Nov. 3, 2006   (CN) .......................... 2006 1 0138045

(51) Int. Cl.
*H01L 29/04* (2006.01)
(52) U.S. Cl. ........... 257/59; 257/E29.117; 257/E29.137; 257/E21.411; 438/30

(58) Field of Classification Search ............... 257/59, 257/E21.411, E29.117, E29.137, E29.151, 257/E51.005, E51.006; 438/30, 39, 149, 438/151, 155, 158, 164, 585
See application file for complete search history.

(56) References Cited

U.S. PATENT DOCUMENTS

| | | | |
|---|---|---|---|
| 6,057,896 A | 5/2000 | Rho et al. | |
| 6,998,640 B2 * | 2/2006 | Wang et al. | ............ 257/59 |
| 7,413,940 B2 | 8/2008 | Lin | |
| 7,553,711 B2 | 6/2009 | Park | |
| 7,776,662 B2 | 8/2010 | Wang et al. | |
| 2003/0017636 A1 * | 1/2003 | Lay et al. | ............ 438/30 |
| 2008/0164470 A1 | 7/2008 | Wang et al. | |

FOREIGN PATENT DOCUMENTS

| CN | 1148600 C | 5/2004 |
|---|---|---|
| CN | 1773693 A | 5/2006 |

* cited by examiner

*Primary Examiner* — Michael Lebentritt
*Assistant Examiner* — Daniel Whalen
(74) *Attorney, Agent, or Firm* — Hasse & Nesbitt LLC; Daniel F. Nesbitt

(57) ABSTRACT

A TFT LCD array substrate and a manufacturing method thereof. The TFT LCD array substrate comprises a substrate. A gate line and a gate electrode that is formed integrally with the gate line are formed on the substrate. A first insulating layer and a semiconductor layer are formed sequentially on the gate line and the gate electrode. A second insulting layer covers sidewalls of the gate line and the gate electrode, the first insulating layer, and the semiconductor layer. An etching stop layer is formed on the semiconductor layer and exposes a part of the semiconductor layer on both sides of the etching stop layer. The TFT LCD of the present invention can be manufactured with a four-mask process.

13 Claims, 5 Drawing Sheets

TFT LCD ARRAY SUBSTRATE AND MANUFACTURING METHOD THEREOF

CROSS-REFERENCE TO RELATED APPLICATIONS

This application is a divisional application of U.S. application Ser. No. 11/935,002, filed Nov. 5, 2007 now U.S. Pat. No. 7,776,662, the disclosure of which is incorporated herein by reference.

FIELD OF THE INVENTION

The present invention relates to a thin film transistor liquid crystal display (TFT LCD), and in particular, to an array substrate of a TFT LCD manufactured with four masks and the manufacturing method thereof.

BACKGROUND OF THE INVENTION

In order to effectively lower the cost and improve the yield of a TFT LCD, the method of manufacturing a TFT LCD array substrate has been gradually simplified from a seven or six-mask process at the beginning to a five-mask process that is popular in the art at present. In recent, a four-mask process based on the slit mask (gray tone mask) technology starts emerging in the field of TFT LCD manufacturing, the key point of which is to replace the second mask (active layer mask) and the third mask (source/drain metal layer mask) of the conventional five-mask process with one slit mask. The four-mask process is described in more detail as follows.

First, a gate electrode is formed on a substrate with the first mask, then a gate insulating layer, an active layer, an ohmic contact layer, and a source/drain metal layer are sequentially deposited on the gate electrode.

Then, with a slit mask, a data line, an active area, a source/drain electrode, and a TFT channel pattern are formed through source/drain metal layer wet etching and a multi-step etching (active layer etching, to ashing, to dry etching, to ohmic contact layer etching).

Then, a passivation layer is deposited on the substrate and a via hole is formed in the passivation layer with the third mask.

Finally, a transparent conductive layer is deposited on the substrate and a pixel electrode is formed with the fourth mask.

Compared with the conventional five-mask process, the above four-mask process is mainly advantageous in that the patterns of the active layer and the source/drain metal layer are formed by one-step slit mask process, thus resulting in the reduction of production period and the manufacturing cost. However, due to use of the slit mask, it demands strict manufacturing precision for the mask. Meanwhile, the pixel-related defects such as channel open and bridge make it hard to improve the yield.

Furthermore, in a conventional back-channel etching type TFT, because there is no etching stop layer over the semiconductor layer (the active layer) for protection, it is necessary to form a relatively thick semiconductor layer in order to void fully etching of the semiconductor layer that may occur when the ohmic contact layer is over-etched. In this case, the leakage current of the TFT LCD array in an off-state increases, thus resulting in great difficulty to improve the contrast ratio of the TFT LCD.

SUMMARY OF THE INVENTION

In view of the above problems in the related art, an aspect of the present invention is to provide a TFT LCD array substrate and the manufacturing method for making the TFT LCD array substrate, wherein the leakage current of the TFT at the off-state is reduced, the manufacturing process of the TFT LCD array substrate is simplified, and the manufacturing cost is lowered.

To achieve the above, the first aspect of the present invention provides a TFT LCD array substrate. The TFT LCD array substrate comprises a substrate. A gate line and a gate electrode that is formed integrally with the gate line are formed on the substrate. A first insulating layer and a semiconductor layer are formed sequentially on the gate line and the gate electrode. A second insulting layer is formed on the substrate and covers the sidewalls of the gate line and the gate electrode, the first insulating layer, and the semiconductor layer. An etching stop layer is formed on the semiconductor layer, typically on a central portion of the semiconductor layer, and exposes a part or parts of the semiconductor layer on both sides of the etching stop layer. An ohmic contact layer is formed on the semiconductor layer, typically on each of the exposed parts of the semiconductor layer, and on the etching stop layer, typically on each of the side portions of the etching stop layer, to provide a trench therebetween in a TFT channel region. First and second source/drain electrodes are formed on the ohmic contact layer, typically respectively on each side of the trench, oppose each other across the TFT channel region. A passivation layer is formed on the first and second source/drain electrodes and the second insulating layer, with a via hole formed in the passivation layer over the second source/drain electrode. A pixel electrode is formed on the passivation layer and connects with the second source/drain electrode through the via hole.

In the preferred embodiments of the present invention, the material of the second insulating layer may be polymer or organic insulator. The gate line, the gate electrode, the source electrode, the data line, and the drain electrode may be a single-layered film formed of a material selected from the group consisting of Cr, W, Ti, Ta, Mo, Al, and Cu, or a multi-layered film formed of a material selected from the group consisting of Cr, W, Ti, Ta, Mo, Al, Cu, and a combination thereof. The first insulating layer and the passivation layer may be formed of a material selected from the group consisting of an oxide, nitride, and oxynitride.

To further achieve the above, another aspect of the present invention provides a method of manufacturing a TFT LCD array substrate. The method comprises the following steps. A gate metal layer, a first insulating layer, a semiconductor layer, and an etching stop layer are sequentially formed on a substrate and are patterned by forming a photoresist pattern as an etching mask so as to form a gate line and a gate electrode. An ashing process is performed so as to remove a part of the photoresist pattern on both sides, the etching stop layer is etched using the remaining photoresist pattern so as to expose a part of the semiconductor layer on both sides, and then the remaining photoresist pattern is removed. A polymer layer is applied on the substrate, and the polymer layer on the semiconductor layer and the etching stop layer is removed. An ohmic contact layer and a source/drain metal layer are sequentially formed and are patterned to form a first and a second source/drain electrodes and a trench in the ohmic contact layer in a channel region. A passivation layer is formed and patterned to form a via hole therein over the second source/drain electrode. A pixel electrode layer is formed and patterned to form a pixel electrode, and the pixel electrode is connected with the second source/drain electrode through the via hole.

In the preferred embodiments of the present invention, the gate metal layer, the first insulating layer, the semiconductor layer, and the etching stop layer may be formed continuously. The gate line and the gate electrode may be patterned by etching of the gate metal layer, the first insulating layer, the semiconductor layer, and the etching stop layer in a multi-step etching process. The ashing process of the photoresist pattern and etching process for further patterning the etching stop layer may be performed continuously in a same reaction chamber or performed separately in separate reaction chambers. The polymer layer may be applied with a spin coating method. The polymer layer on the semiconductor layer and the etching stop layer may be removed with an oxygen reactive ion etching process. The ohmic contact layer and the source/drain metal layer may be formed continuously. The ohmic contact layer and the source/drain metal are patterned by etching performed in a one-step etching process or in a two-step etching process.

Compared with the related art, the TFT LCD array substrate and the manufacturing method thereof according to the present invention have at least the following three merits. First, due to the presence of the etching stop layer, the thickness of the semiconductor layer (an active layer) can be greatly decreased, thus ensuring a low off-state current. Secondly, a four-mask process for manufacturing a TFT LCD can be realized without using a slit mask, greatly reducing the difficulty and cost of manufacturing process and ensuring a high yield. Thirdly, a polymer layer may be used to form a relatively flat surface on which the source/drain metal electrode pattern is formed, reducing the occurrence of the metal line open and accumulation of the internal stress in the passivation layer and thereby improving the yield.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Exemplary embodiments of the present invention will be described hereinafter with reference to the accompanying drawings. However, the present can be realized in different ways and should not be limited to the embodiments set forth hereinafter. It should be understood by those skilled in the art that in this description when a layer or a element is referred to as being "on" or "connected to" another layer or element, this layer or element can be directly on or directly connected to the other layer or element, or an intervening layer may also be present therebetween.

Figure 1:
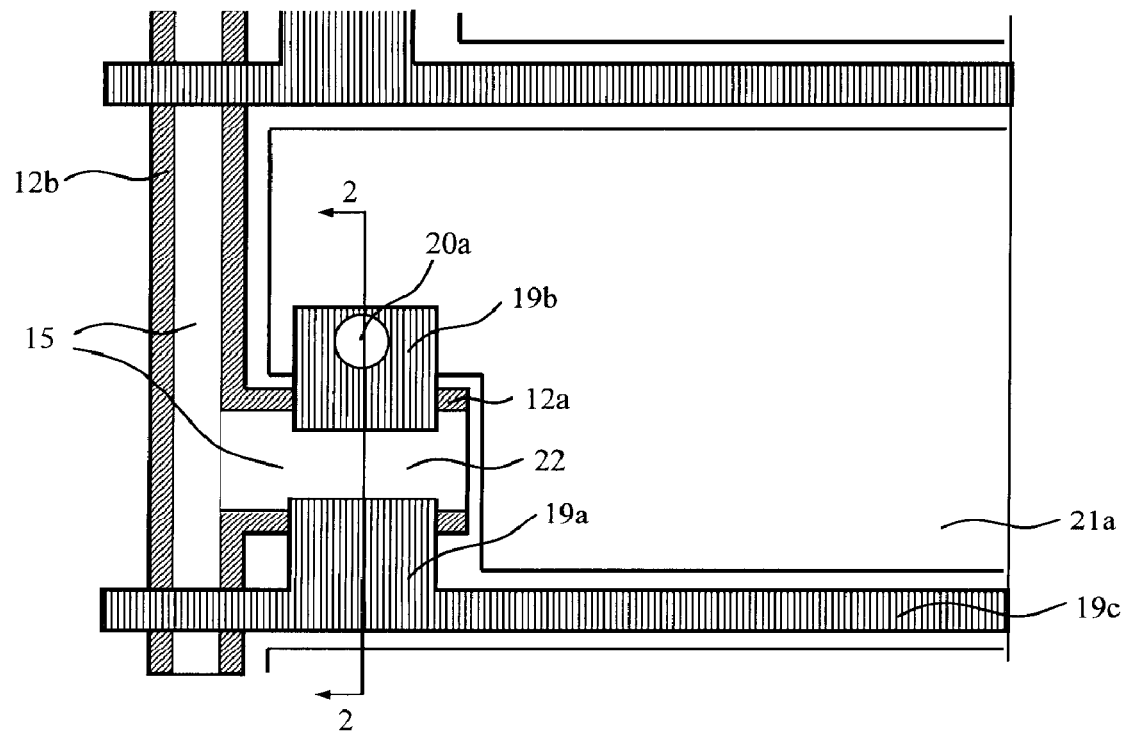
FIG. 1 is a partial plan view of a TFT LCD array substrate according to an embodiment of the present invention.
Figure 2:
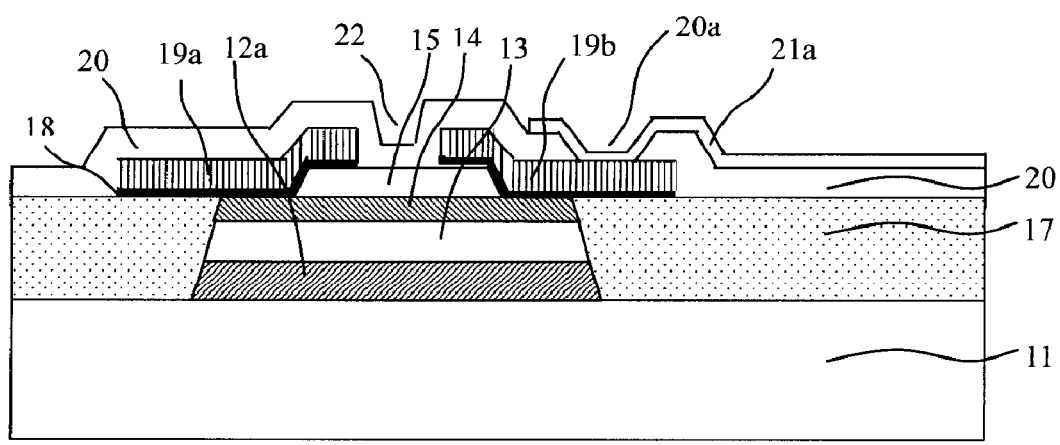
FIG. 2 is a cross-sectional view taken along the line 2-2 in FIG. 1.

FIG. 1 is a partial plan view of the TFT LCD array substrate according to the embodiment of the present invention, and FIG. 2 is a cross-sectional view taken along the line 2-2 in FIG. 1. In particular, a gate metal layer 12, a gate insulating layer 13, and a semiconductor layer 14 are formed in this order on a transparent substrate 11 such as a transparent glass substrate. The gate metal layer 12 is formed into a gate line 12b portion and a gate electrode 12a portion that are formed integrally. An etching stop layer 15 is formed on a central portion of the semiconductor layer 14 to expose the underlying semiconductor layer 14 on both side portions thereof. A second insulating layer such as a polymer layer 17 is formed on the transparent substrate 11 and covers the sidewalls of each of the gate line 12b and the gate electrode 12a, the gate insulating layer 13, and the semiconductor layer 14. An ohmic contact layer 18 is formed on a portion of the polymer layer 17, on both exposed sides portions of the semiconductor layer 14, and on both side portions of the etching stop layer 15, to provide a trench 22 that exposes a portion of the etching stop layer 15 in a TFT channel region. Source/drain metal electrodes 19a, 19b are formed on the ohmic contact layers 18 on each side of the trench 22. A passivation layer 20 is formed on the polymer layer 17, the source/drain metal electrodes 19a, 19b, and the exposed portion of the etching stop layer 15, between the edges of the source/drain metal electrodes 19a, 19b. A pixel electrode 21a is formed on the passivation layer 20 and connected to the drain metal electrode 19b through a via hole 20a that is formed in the passivation layer 20 (FIG. 2).

Furthermore, a data line 19c is formed integrally with the source/drain electrode 19a and perpendicular to the gate line 12b, as shown in FIG. 1. The data line 19c and the gate line 12b cross with each other and define edges of a pixel area of the TFT LCD array substrate. The polymer layer 17 may be formed of a material selected from the group consisting of epoxy resin and polyamine, or be formed of other organic insulating materials such as pentacene, polyvinyl pyrrolidone, polyimide, and acryl.

In the TFT LCD array substrate according to the present invention, due to the protection of the etching stop layer 15 over the semiconductor layer 14, the thickness of the semiconductor layer 14 can be rendered small, for example, about one fifth of that of the semiconductor layer in a conventional back etching type TFT. Therefore, the leakage current of the TFT at the off-state can be reduced remarkably, and the characteristics of the TFT LCD such as contrast ratio will be improved efficiently. Moreover, because the present invention employs the polymer layer 17 to form a flat surface, the pattern of the source/drain metal electrodes 19a, 19b can be formed on the flat surface, reducing the occurrence of metal line open and the accumulation of the internal stress in the passivation layer 20 and thereby improving the yield.

FIGS. 3 to 13 shows the views at different stages during manufacturing of the TFT LCD array substrate through a four-mask process according to the embodiment of the present invention, respectively.

Figure 3:
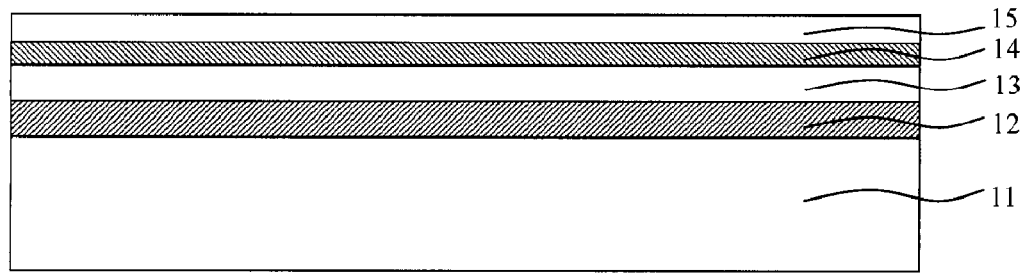
FIG. 3 is a cross-sectional view taken along the line 2-2 in FIG. 1 after the gate metal layer, the gate insulating layer, the semiconductor layer, and the etching stop layer are sequentially deposited on the substrate according to the embodiment.

First, as shown in FIG. 3, on the substrate 11 such as a transparent glass substrate or a quartz substrate, the gate metal layer 12 with a thickness of about 500 to about 4000 Å is formed, for example, by a deposition method such as a sputtering or a thermal evaporation method. The gate metal layer 12 can be a single-layered film formed of a material selected from the group consisting of Cr, W, Ti, Ta, Mo, Al, and Cu, or a multi-layered film formed of a material selected from the group consisting of Cr, W, Ti, Ta, Mo, Al, Cu or a combination thereof. Then, the gate insulating layer 13 with a thickness of about 1000 to about 4000 Å, the semiconductor layer 14 with a thickness of about 300 to about 500 Å and the etching stop layer 15 with a thickness of about 1000 to about 1500 Å are sequentially formed on the gate metal layer 12, for example, by a plasma enhanced chemical vapor deposition (PECVD) method. The gate insulating layer 13 and the etching stop layer 15 can be formed of a material selected from the group consisting of oxide, nitride, and oxynitride, the reaction gas for which can be $SiH_4$, $NH_3$, and $N_2$ or $SiH_2Cl_2$, $NH_3$, and $N_2$. The reaction gas for the semiconductor layer 14 can be $SiH_4$ and $H_2$ or $SiH_2Cl_2$ and $H_2$, so that an amorphous silicon (a-Si) layer is formed as the semiconductor layer 14.

Figure 4:
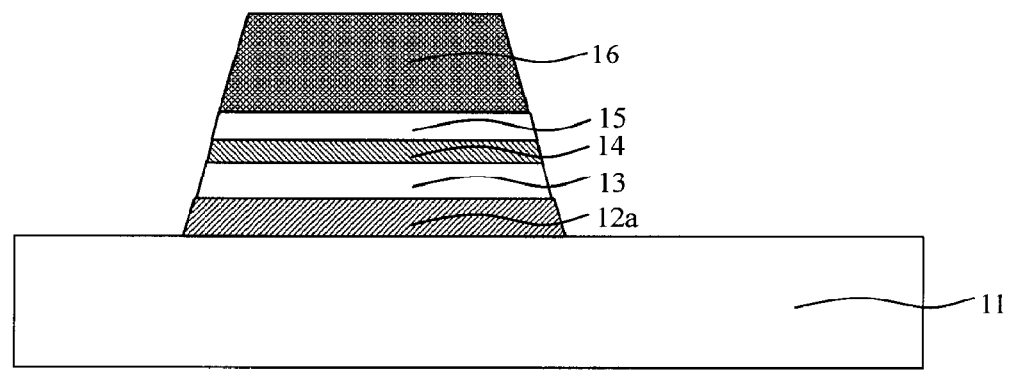
FIG. 4 is a cross-sectional view taken along the line 2-2 in FIG. 1 after the multi-step etching is performed according to the embodiment.
Figure 5:
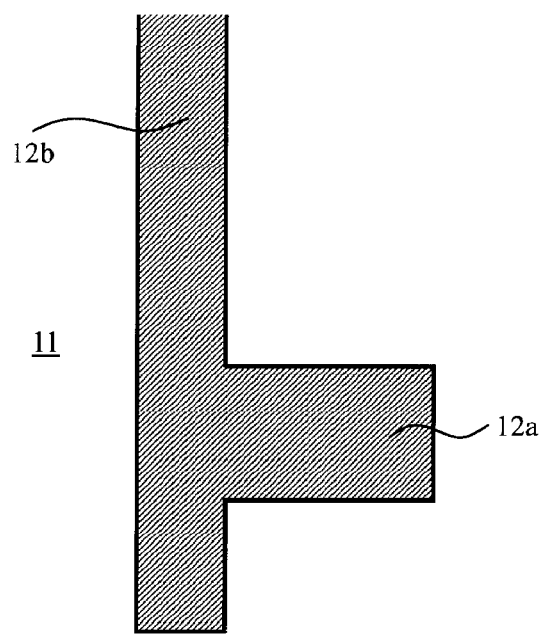
FIG. 5 is a plan view after the multi-step etching is performed according to the embodiment.

The stacked layers of the gate metal layer 12, the gate insulating layer 13, the semiconductor layer 14, and the etching stop layer 15 are patterned with a first mask so as to form the desired pattern. A photoresist layer, for example, is spin coated on the stacked layers and a photoresist pattern 16 is formed as an etching mask with the first mask by exposing and developing process. The gate metal layer 12, the gate insulating layer 13, the semiconductor layer 14, and the etching stop layer 15 which are not covered by the photoresist pattern 16 are etched in a multi-step etching process. FIG. 4 is a cross-sectional view taken along the line 2-2 in FIG. 1 and FIG. 5 is a plan view after the multi-step etching is performed according to the embodiment, at this stage of the method. The gate metal layer 12 is patterned to form a gate electrode 12a and a gate line 12b that are formed integrally, as shown in FIGS. 4 and 5. The etching gas for the gate metal layer 12 can be $SF_6/O_2$ or $Cl_2/O_2$, the etching gas for the gate insulating layer 13 and the etching stop layer 15 can be $SF_6/O_2$, $Cl_2/O_2$ or $HCl/O_2$, and the etching gas for the semiconductor layer 14 (the a-Si layer) can be $SF_6/Cl_2$, $SF_6/HCl$ and other equivalent gases.

Figure 6:
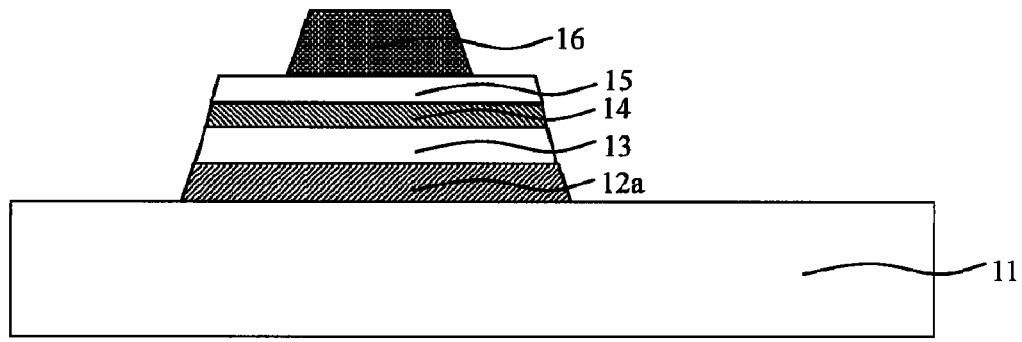
FIG. 6 is a cross-sectional view taken along the line 2-2 in FIG. 1 after the ashing process is performed on the photoresist pattern according to the embodiment.
Figure 7:
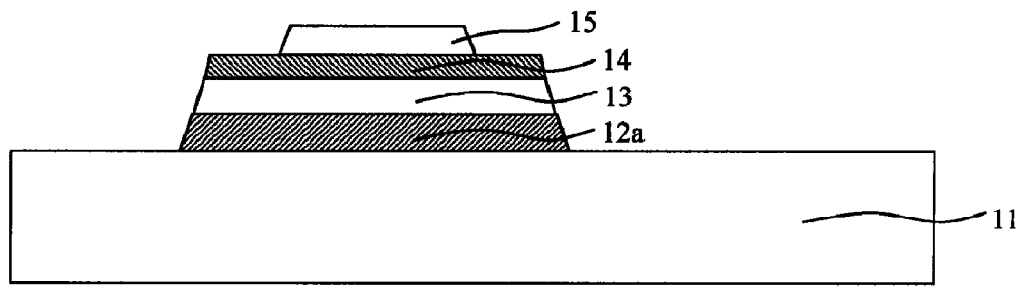
FIG. 7 is a cross-sectional view taken along the line 2-2 in FIG. 1 after the etching process is performed to etch the etching stop layer according to the embodiment.
Figure 8:
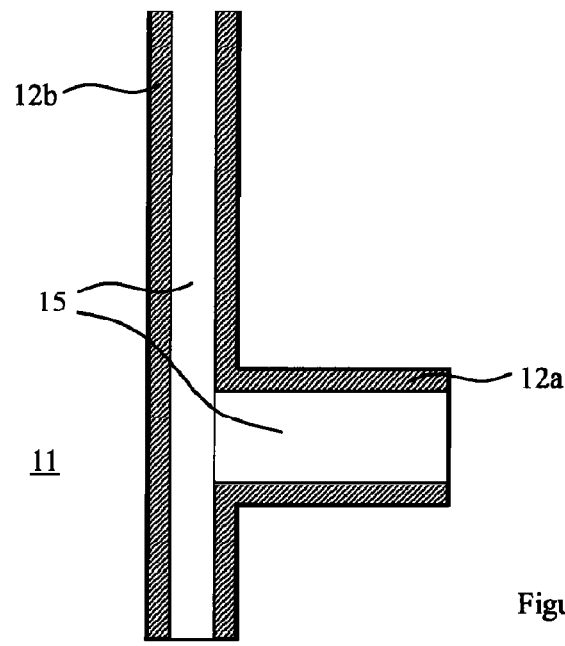
FIG. 8 is a plan view after the etching process is performed to etch the etching stop layer according to the embodiment.

After patterning the gate metal layer 12, the gate insulating layer 13, the semiconductor layer 14, and the etching stop layer 15, an ashing process of the photoresist pattern 16 is performed so as to decrease the thickness and width of the photoresist pattern 16, with a part or parts of the etching stop layer 15 being exposed from the photoresist pattern 16 on both sides of the photoresist pattern 16, as shown in FIG. 6. The etching gas for the ashing process can be $SF_6/O_2$, $Cl_2/O_2$, and other equivalent gases. Then, the exposed part of the etching stop layer 15 is etched, and correspondingly the central portion of the etching stop layer 15 that is covered by the remaining photoresist pattern 16 remains. After etching the etching stop layer 15, a part of semiconductor layer 14 on both sides of the photoresist pattern 16 is exposed, and a desired pattern of the etching stop layer 15 is formed. The etching gas for the etching stop layer can be $SF_6/O_2$, $Cl_2/O_2$, or $HCl/O_2$. Finally, the remaining photoresist pattern 16 is stripped off by using the chemicals, leaving a pattern as shown in FIGS. 7 and 8. The ashing process and the etching process for patterning the etching stop layer can be continuously performed in a same reaction chamber or separately performed in separate reaction chambers.

Figure 9:
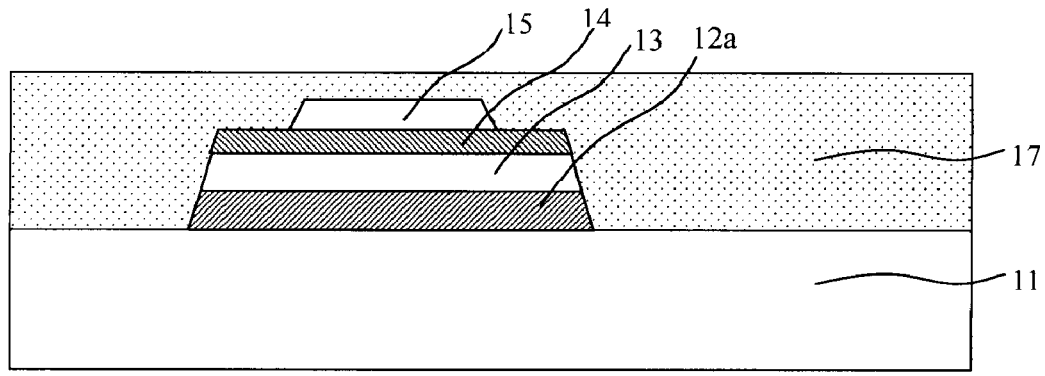
FIG. 9 is a cross-sectional view after the polymer layer is applied on the substrate according to the embodiment.
Figure 10:
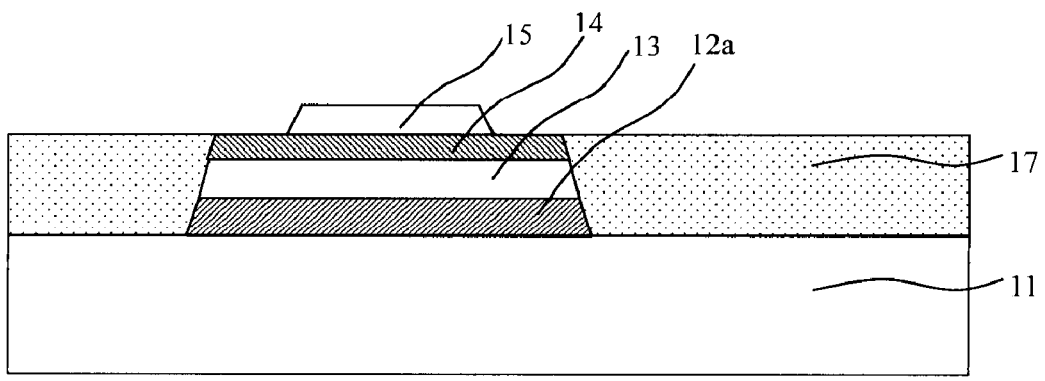
FIG. 10 is a cross-sectional view taken along the line 2-2 in FIG. 1 after the oxygen reaction ion etching process is performed on the polymer layer according to the embodiment.

Then, as shown in FIG. 9, after forming the pattern of the etching stop layer 15, the polymer layer 17 is uniformly spin coated on the substrate 11 and covers the semiconductor layer 14, the etching stop layer 15, and the remainder of the substrate 11 to a uniform thickness. The polymer layer 17 is solidified or cured, for example, by heat or irradiation of UV. The thickness of the polymer layer 17 is larger than the total thickness of the gate metal layer 12, the gate insulating layer 13, the semiconductor layer 14, and the etching stop layer 15, providing a thin layer of the polymer material thereover. After the solidification of the polymer layer 17, the polymer layer 17 is partially thinned, and preferably uniformly thinned, by removing the upper-most portion of the polymer layer 17, for example, by using an oxygen reactive ion etching (RIE) method and detecting with a endpoint detector (EPD), so that the etching stop layer 15 and then the semiconductor layer 14 are exposed, as shown in FIG. 10, whereby the semiconductor layer 14 and the polymer layer 17 collectively form a flat top surface, as shown in FIG. 10.

Figure 11:
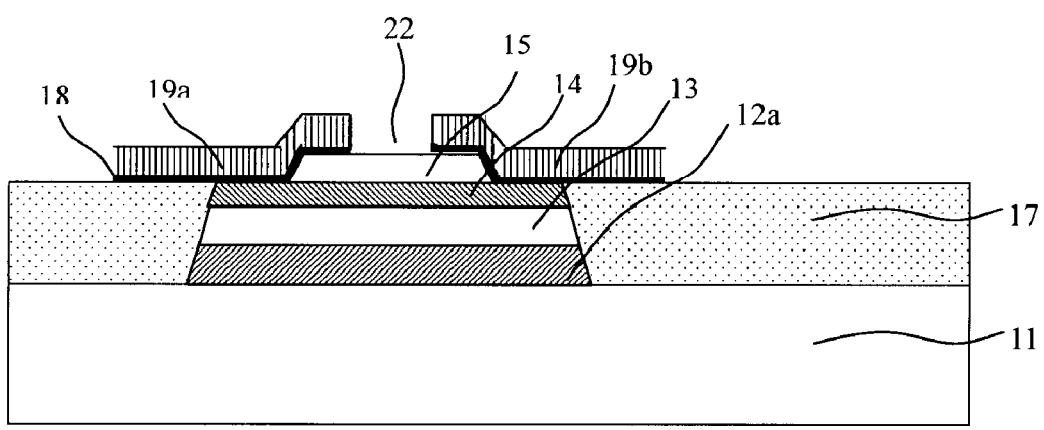
FIG. 11 is a cross-sectional view taken along the line 2-2 in FIG. 1 after the source/drain metal electrodes are formed according to the embodiment.
Figure 12:
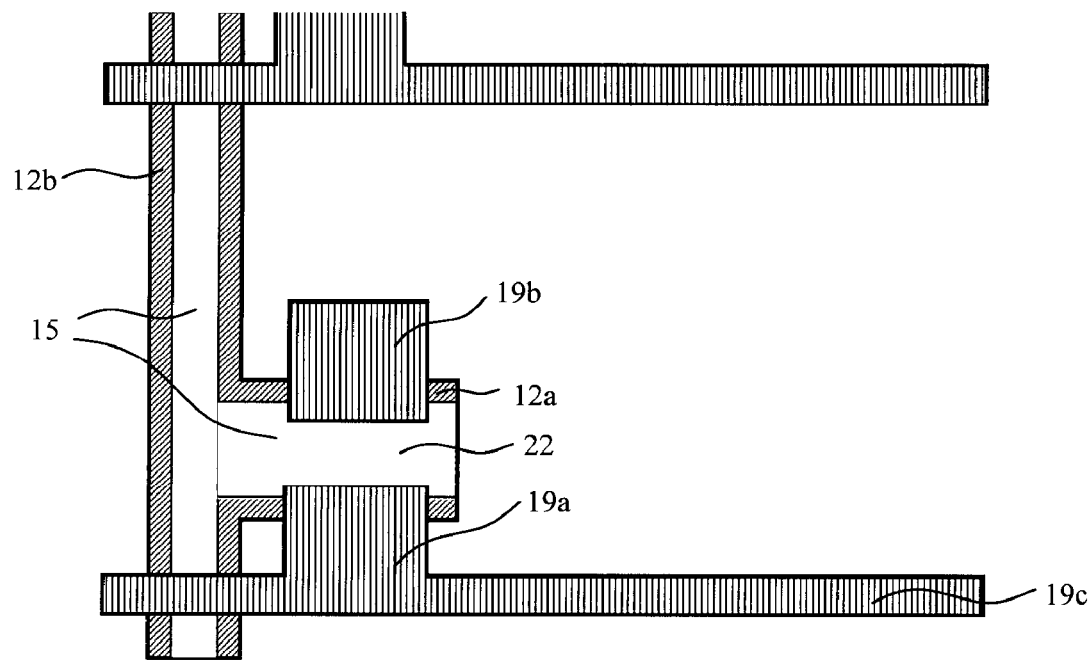
FIG. 12 is a plan view after the source/drain metal electrodes are formed according to the embodiment.

After partially thinning the polymer layer 17, the ohmic contact layer 18 and the source/drain electrode layer 19 are formed sequentially. The ohmic contact layer 18 is deposited, for example, by a PECVD process with a thickness of about 300-600 Å, and the reaction gas for the ohmic contact layer 18 can be $SiH_4$, $H_2$ or $SiH_2Cl_2$. The ohmic contact layer 18 may be doped as an $n^+$ a-Si layer and the like. The source/drain metal electrode layer 19 is deposited, for example, by a sputtering or a thermal evaporation method with a thickness of about 500-2500 Å, and the source/drain metal electrode layer 19 can be formed of a metal selected from the group consisting of Cr, W, Ti, Ta, Mo, Al, Cu, and a combination thereof. After depositing the ohmic contact layer 18 and the source/drain metal electrode layer 19, the source/drain metal electrode layer 19 is patterned with the second mask so as to form the source/drain electrodes 19a, 19b and the data line 19c, and the etching method can be either a dry etching or a wet etching method. After patterning the source/drain metal electrodes 19a, 19b, the exposed ohmic contact layer 18 between the source/drain metal electrodes 19a, 19b is further etched by a dry etching method so as to form a trench 22, which cuts off the connection between the source/drain electrodes 19a, 19b and exposes the etching stop layer in the channel region of the TFT, as shown in FIGS. 11 and 12. The etching gas for the ohmic contact layer can be $SF_6/Cl_2$ or $SF_6/HCl$. The ohmic contact layer 18 and the source/drain metal layer 19 can be etched in a one-step etching process or in a two-step etching process.

Figure 13:
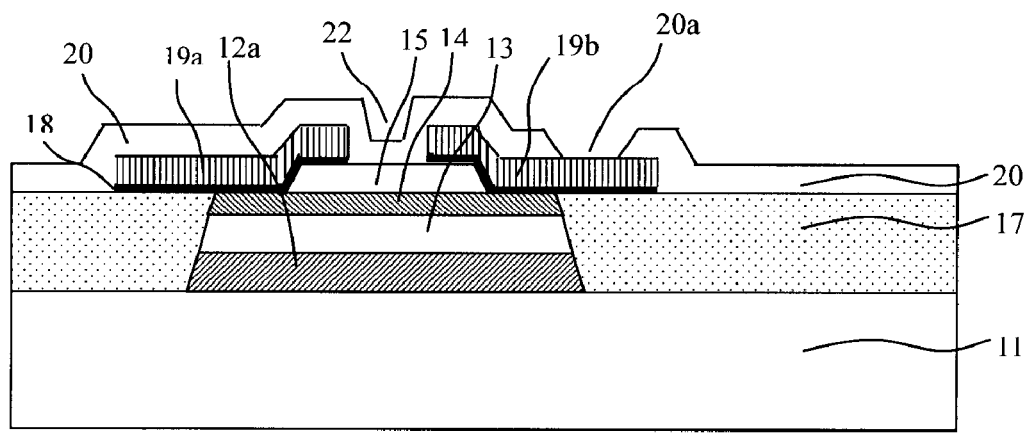
FIG. 13 is a cross-sectional view taken along the line 2-2 in FIG. 1 after the passivation layer pattern (a via hole pattern) is formed according to the embodiment.

After patterning the ohmic contact layer 18 and the source/drain metal layer 19, the passivation layer 20 with a thickness of about 700-2000 Å is formed by a Plasma Enhanced Chemical Vapor Deposition (PECVD) method. The passivation layer 20 can be oxide, nitride, or oxynitride, for example, silicon oxide, silicon nitride, or silicon oxynitride. The corresponding reaction gas can be $SiH_4$, $NH_3$, and $N_2$ or $SiH_2Cl_2$, $NH_3$, and $N_2$. Then the passivation layer 20 is patterned with the third mask, thus a via hole 20a is formed therein over the source/drain electrode 19b, as shown in FIG. 13. The etching gas for the passivation layer 20 can be $SF_6/O_2$, $Cl_2/O_2$ or $HCl/O_2$.

After forming the via hole 20a, a transparent conductive layer with a thickness of about 300-600 Å is formed by a sputtering or a thermal evaporation method, which typically comprises indium tin oxide (ITO) or indium zinc oxide (IZO). Finally, the transparent conductive layer is patterned with the fourth mask so as to form the pixel electrode 21a, which is connected with the source/drain electrode 19b through the via hole 20a, thus completing the manufacture of the array substrate, as shown in FIGS. 1 and 2.

In the embodiments of the present invention, the TFT LCD array substrate can be manufactured with four masks. The difficulty and cost of the process can be greatly decreased and the high yield can be ensured due to nonuse of the slit mask, compared with the conventional four-mask process in the related art.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A thin film transistor liquid crystal display (TFT LCD) array substrate, comprising:
    a substrate;
    a gate line and a gate electrode formed integrally with the gate line, which are formed on the substrate;
    a first insulating layer and a semiconductor layer formed sequentially on the gate line and the gate electrode;
    a second insluting layer formed on the substrate and covering sidewalls of the gate line and the gate electrode, the first insulating layer, and the semiconductor layer, wherein the semiconductor layer and the second insulating layer collectively form a flat top surface;
    an etching stop layer formed on a central portion of the semiconductor layer and exposing a part of the semiconductor layer on both sides of the etching stop layer;
    an ohmic contact layer formed on each of the exposed parts of the semiconductor layer and on the side portions of the etching stop layer, to provide a trench formed therebetween in a TFT channel region;
    a first and a second source/drain electrodes formed on the ohmic contact layer, on each side of the trench and opposing each other across the TFT channel region;
    a passivation layer formed on the first and second source/drain electrodes and the second insulating layer, having a via hole formed in the passivation layer over the second source/drain electrode; and
    a pixel electrode formed on the passivation layer and connected with the second source/drain electrode through the via hole.

2. The array substrate according to claim 1, further comprising a data line formed integrally with the first source/drain electrode.

3. The array substrate according to claim 2, wherein the gate line, the gate electrode, the data line, and the first and second source/drain electrode are a single-layered film formed of a material selected from the group consisting of Cr, W, Ti, Ta, Mo, Al, and Cu, or a multi-layered film formed of a material selected from the group consisting of Cr, W, Ti, Ta, Mo, Al, Cu, and a combination thereof.

4. The array substrate according to claim 1, wherein the second insulating layer is formed of a material selected from the group consisting of polymer and organic insulator.

5. The array substrate according to claim 1, wherein the first insulating layer and the passivation layer are formed of a material selected from the group consisting of oxide, nitride and oxynitride.

6. A TFT LCD array substrate, made according to a method comprising the steps of:
    (a) forming stacked layers of a gate metal layer, a first insulating layer, a semiconductor layer, and an etching stop layer sequentially on a substrate and patterning the stacked layers by forming a photoresist pattern as an etching mask so as to form a gate line and a gate electrode;
    (b) performing an ashing process so as to remove a part of the photoresist pattern on both sides, etching the etching stop layer using the remaining photoresist pattern so as to expose a part of the semiconductor layer on both sides, and then removing the remaining photoresist pattern;
    (c) applying a polymer layer on the substrate to cover sidewalls of the gate line and the gate electrode, the first insulating layer, and the semiconductor layer, and removing the polymer layer above the semiconductor layer and the etching stop layer, wherein the semiconductor layer and the polymer layer collectively form a flat ton surface;
    (d) forming an ohmic contact layer and a source/drain metal layer sequentially and patterning the source/drain metal layer and ohmic contact layer to form a first and a second source/drain electrodes and a trench in the ohmic contact layer in a channel region;
    (e) forming a passivation layer and patterning the passivation layer to form a via hole over the second source/drain electrode, and
    (f) forming a pixel electrode layer and patterning the pixel electrode layer to form a pixel electrode, wherein the pixel electrode is connected with the second source/drain electrode through the via hole.

7. The TFT LCD array substrate according to claim 6, wherein the forming of the gate metal layer, the gate insulating layer, the semiconductor layer, and the etching stop layer sequentially is performed continuously.

8. The TFT LCD array substrate according to claim 6, wherein the gate metal layer, the first insulating layer, the semiconductor layer, and the etching stop layer are patterned in a multi-step etching process.

9. The TFT LCD array substrate according to claim 6, wherein in the step (b), the ashing process of the photoresist layer and the etching of the etching stop layer are sequentially performed in a same reaction chamber or separately performed in separate reaction chambers.

10. The TFT LCD array substrate according to claim 6, wherein the applying of the polymer layer is performed with a spin coating method.

11. The TFT LCD array substrate according to claim 6, wherein the removing of the polymer layer above the semiconductor layer and the etching stop layer is performed by an oxygen reactive ion etching process.

12. The TFT LCD array substrate according to claim 6, wherein the forming of the ohmic contact layer and the source/drain metal layer sequentially is performed continuously.

13. The TFT LCD array substrate according to claim 6, wherein patterning of the source/drain metal layer and the ohmic contact layer is performed in one-step etching process or in two-step etching process.

* * * * *